United States Patent [19]

Marbot

[11] Patent Number: 5,414,830
[45] Date of Patent: May 9, 1995

[54] APPARATUS FOR SERIALIZATION AND DESERIALIZATION OF DATA, AND RESULTANT SYSTEM FOR DIGITAL TRANSMISSION OF SERIAL DATA

[75] Inventor: Roland Marbot, Versailles, France
[73] Assignee: Bull, S.A., Paris, France
[21] Appl. No.: 727,429
[22] Filed: Jul. 9, 1991

[30] Foreign Application Priority Data

Jul. 11, 1990 [FR] France .............. 90 08812

[51] Int. Cl.⁶ .............................................. G06F 3/00
[52] U.S. Cl. ............................. 395/500; 364/260; 364/260.4; 364/259.9; 364/270.3; 364/DIG. 1
[58] Field of Search ................. 395/800, 500, 550

[56] References Cited

U.S. PATENT DOCUMENTS

| | | | |
|---|---|---|---|
| 3,587,043 | 6/1971 | Mengani | 371/47.1 |
| 3,993,957 | 11/1976 | Davenport | 377/47 |
| 4,404,681 | 9/1983 | Hullwegen | 375/102 |
| 4,496,934 | 1/1985 | Furukawa | 340/347 DD |
| 4,499,454 | 2/1985 | Shimada | 341/58 |
| 4,628,298 | 12/1986 | Hafle | 341/1 |
| 4,715,050 | 12/1987 | Tanaka et al. | 375/111 |
| 4,864,303 | 9/1989 | Ofek | 341/95 |
| 4,873,491 | 10/1989 | Wilkins | 328/155 |
| 4,912,433 | 3/1990 | Motegi et al. | 331/8 |
| 4,922,141 | 5/1990 | Lofgren et al. | 307/595 |
| 4,972,161 | 11/1990 | Davies | 331/1 A |
| 5,025,257 | 6/1991 | Hartley | 341/101 |
| 5,040,195 | 8/1991 | Kosaka | 375/114 |
| 5,079,519 | 1/1992 | Ashby et al. | 331/1 A |
| 5,079,770 | 1/1992 | Scott | 370/112 |
| 5,084,891 | 1/1992 | Ariyavisitakal | 371/42 |
| 5,148,385 | 9/1992 | Frazier | 364/728.07 |

FOREIGN PATENT DOCUMENTS

| | | | |
|---|---|---|---|
| 0081750 | of 0000 | European Pat. Off. | |
| 0220802 | 6/1987 | European Pat. Off. | H03M 9/00 |
| 0292943 | 11/1988 | European Pat. Off. | G06F 7/00 |
| 0313875 | 5/1989 | European Pat. Off. | H03M 9/00 |
| 0346896 | 12/1989 | European Pat. Off. | H03M 9/00 |
| 8805236 | of 0000 | WIPO | |

OTHER PUBLICATIONS

IBM Technical Disclosure Bulletin, vol. 26, No. 3A, 1983 N.Y., pp. 990-991, Hernandez "Frequency Multiplier Using Delay Circuits".

*Primary Examiner*—Eric Coleman
*Attorney, Agent, or Firm*—Kerkam, Stowell, Kondracki & Clarke; Edward J. Kondracki

[57] ABSTRACT

The apparatus 15 for serialization of words of N bits SYNC, OP, D0-D7 produces N clock signals CL0-CL9 of period T, delayed successively by T/N, to control respective registers (36, 38, 39) for the successive output of the bits of each word. An adder (40) reunites these bits in a serial data transmission signal (TS). The deserialization is applicable in particular to network transmission systems, and especially to information processing systems.

13 Claims, 8 Drawing Sheets

APPARATUS FOR SERIALIZATION AND DESERIALIZATION OF DATA, AND RESULTANT SYSTEM FOR DIGITAL TRANSMISSION OF SERIAL DATA

CROSS REFERENCE TO RELATED APPLICATIONS FOR PCT/US 3212

This application is related to the following co-pending applications of applicant:

| | |
|---|---|
| PCT/US 3212 | PHASE-LOCKED LOOP AND RESULTING FREQUENCY MULTIPLIER U.S. Ser. No. 07/762,018, filed September 18, 1991 and FR/PCT 91/00058, filed in France January 30, 1991, and corresponding to Fr. Appl. 90.01366 filed February 6, 1990; |
| US 3213 | METHOD AND SYSTEM FOR DIGITAL TRANSMISSION OF SERIAL DATA, U.S. Ser. No. 07/727,430 filed July 9, 1991, corresponding to Fr. 90.08811 filed July 11, 1990; |
| US 3215 | DATA SAMPLING APPARATUS, AND RESULTANT DIGITAL TRANSMISSION SYSTEM, U.S. Ser. No. 07/727,843, filed July 9, 1991, corresponding to Fr. 90.08813, filed July 11, 1990. |

The subject matter of the aforenoted U.S. applications is hereby incorporated herein by reference.

1. Field of the Invention

The invention relates to an apparatus for serialization and an apparatus for deserialization of data, and to the resultant system for digital transmission of serial data resulting therefrom.

The invention also applies generally to any serialization and deserialization of data and can be adapted to any system for digital transmission of serial data. It is advantageous more particularly in high-speed serial transmission systems with a rate higher than 1 Gbps (1 gigabit per second), for example. The systems that benefit the most from the invention are in particular network transmission systems, such as local area networks or digital television networks, in particular for videophone systems. The application that will be used as an example here relates to networks of processors in information processing systems. The object of this application is the interconnection of processors with memories, other processors, or external or internal peripherals.

2. Background of the Invention

A serialization method ordinarily used until now comprises loading a dephasing register with N parallel bits, and emptying it serially. Conversely, deserialization comprises loading an analogous register serially and emptying it in parallel. Another method comprises replacing the dephasing register with a multiplexer in transmission and a demultiplexer in reception. The multiplexer and demultiplexer are each controlled by one counter. The two methods use a conventional phase-locked loop apparatus, or PLL, to generate the clock. The clock signal controls the serialization and deserialization at a frequency twice the maximum frequency of the data signal. The doubling is necessary to control the counter, or the cells of the dephasing register, at a predetermined edge, either leading or trailing, of the clock signal. For example, emptying at 1 Gbps would require a 1 GHz clock, while the data train does not exceed 500 MHz. This example illustrates the limitation of the maximum rate for serial bits, because of an overly high clock frequency. On the other hand, at this clock frequency, serial bits must be associated with a clock frequency of the words that is N or 2N times slower. These two clocks must be synchronized to assure the transmission and the correct recovery of the bits. In practice, synchronism is difficult to obtain reliably for frequencies as high as that of the bit clock. In conclusion, using a method requiring a frequency twice that of the serial bit rate has the disadvantage of limiting the bit rate and of needing highly sophisticated equipment, to assure that the bit clock and the word clock are synchronized.

The invention overcomes this disadvantage by using clock with a frequency lower than the bit rate, and this frequency can advantageously be that of the word clock.

On the other hand, in a digital data transmission system, the serialized bits are encoded to constitute the transmission signal. The encoding is currently known by the abbreviation NRZ (non-return to zero) or the variant NRZI (non-return to zero inverted), depending on whether each logical 1 is translated into an edge changing the encoded signal and each logical 0 maintains the level of the encoded signal. The encoding of each bit is ordinarily done by an encoding cell including a register pilot-controlled by the clock signal of the transmitter. In a self-clocking system, the transmission signal incorporates the clock and synchronizing data. In a synchronized system, these data are transmitted separately. In the receiver, the received transmission signal is put back into shape in order to be decoded, then deserialized, under the control of the received clock signal in a synchronized system. The clock signal is recovered on the basis of the transmission signal, in a self-clocking system. The decoding is done by N registers that receive the transmission signal and are controlled by the clock signal. In these systems, the encoding registers are added to the serializer, and the decoding registers are added to the deserializer. The resultant integrated electrical circuits are therefore complex and bulky.

The invention overcomes this disadvantage as well, allowing the encoding registers to play the role of serialization registers, and the decoding registers to play the role of deserialization registers. This possibility offer the advantage of notable simplification of the circuits and a greater scale of integration of these circuits.

OBJECT AND SUMMARY OF THE INVENTION

An apparatus for serialization of words of N bits under the command of a clock signal, according to the invention, is characterized in that it includes a generator of N clock signals of period T that are delayed successively by the value T/N, a circuit for controlling the successive output of the bits of each word at the rate of N delayed clock signals, and a logical adder of the output bits.

If encoding is to be added to the serialization, the control circuit advantageously comprises N registers used for the encoding of the N bits.

In corollary fashion, an apparatus for deserialization of words of N bits under the control of a clock signal according to the invention is characterized in that it includes a generator of N clock signals of period T delayed successively by the value T/N, and a control circuit reacting to at least some of the N clock signals to control the parallel output of the respective bits of each word.

If decoding is to be added to the deserialization, the N registers are advantageously the decoding registers of the serial transmission signal.

The invention also relates to a system for digital transmission of data, including a transmitter using a clock signal and a parallel input signal and including a serializer and an encoder, and a receiver including a clock recuperator that reconstitutes the clock signal, a deserializer and a decoder, characterized in that the period of the clock signal is a multiple N of the period of recurrence of the serial bits, and the serializer and deserializer, respectively, are those defined above.

BRIEF DESCRIPTION OF THE DRAWINGS

The characteristics and advantages of the invention will become clearly apparent from the ensuing description given by way of example, taken in conjunction with the accompanying drawings.

DESCRIPTION OF THE PREFERRED EMBODIMENTS

Figure 1:
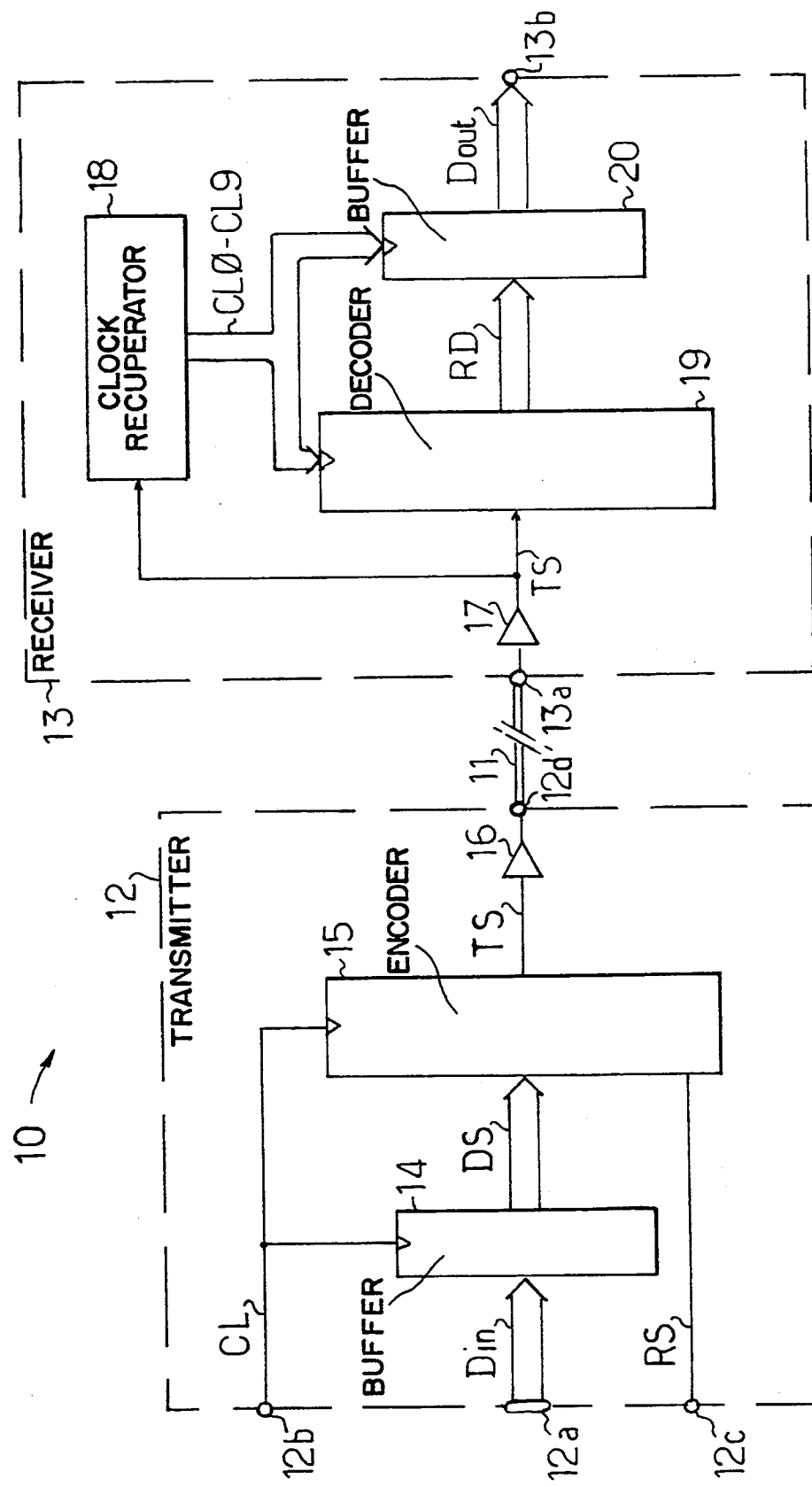
FIG. 1, in the form of a mimic diagram, illustrates a self-clocking digital transmission system according to the invention.

FIG. 1 is a mimic diagram of a self-clocking digital transmission system 10 according to the invention. The system 10 includes a transmission line 11, a transmitter 12 and a receiver 13. The transmitter 12 includes: an input terminal 12a that receives the parallel data of an input signal Din, a clock input terminal 12b receiving a clock signal CL, an input terminal 12c receiving a reset signal RS, and an output terminal 12d connected to the line 11; an input buffer 14 receiving the input signal Din and pilot-controlled by the clock signal CL to furnish a parallel data signal DS; a serializer-encoder 15 receiving the clock signal CL, the parallel data signal DS and the reset signal RS and furnishing a serial transmission signal TS; and an output amplifier 16 applying the transmission signal TS to the output terminal 12d of the transmitter 12. The receiver 13 includes: an input terminal 13a connected to the line 11 to receive the transmission signal TS and an output terminal 13b furnishing the parallel data of the output signal Dout; an input amplifier 17 connected to the input terminal 13a and shaping the transmission signal TS received from the line 11; a clock recuperator 18 receiving the transmission signal TS from the amplifier 17 to restore the auxiliary clock signals CL0-CL9; a deserializer-decoder 19 receiving the transmission signal TS and the auxiliary clock signals CL0-CL9 and producing a signal of restored parallel data RD; and an output buffer 20 receiving the restored parallel data signal RD and some of the auxiliary clock signals CL0-CL9 and furnishing the data output signal Dout to the output terminal 13b of the receiver 13.

In the system 10, the input signal Din is a byte of eight data bits associated with a parity bit. This group of nine bits of the input signal comprises an input data word. The input buffer 14 is a conventional element, for example comprising nine edge registers, each respectively receiving the nine parallel bits of the input signal word Din and Controlled by the clock signal CL. The amplifiers 16 and 17 may also be conventional elements.

Figure 2A:
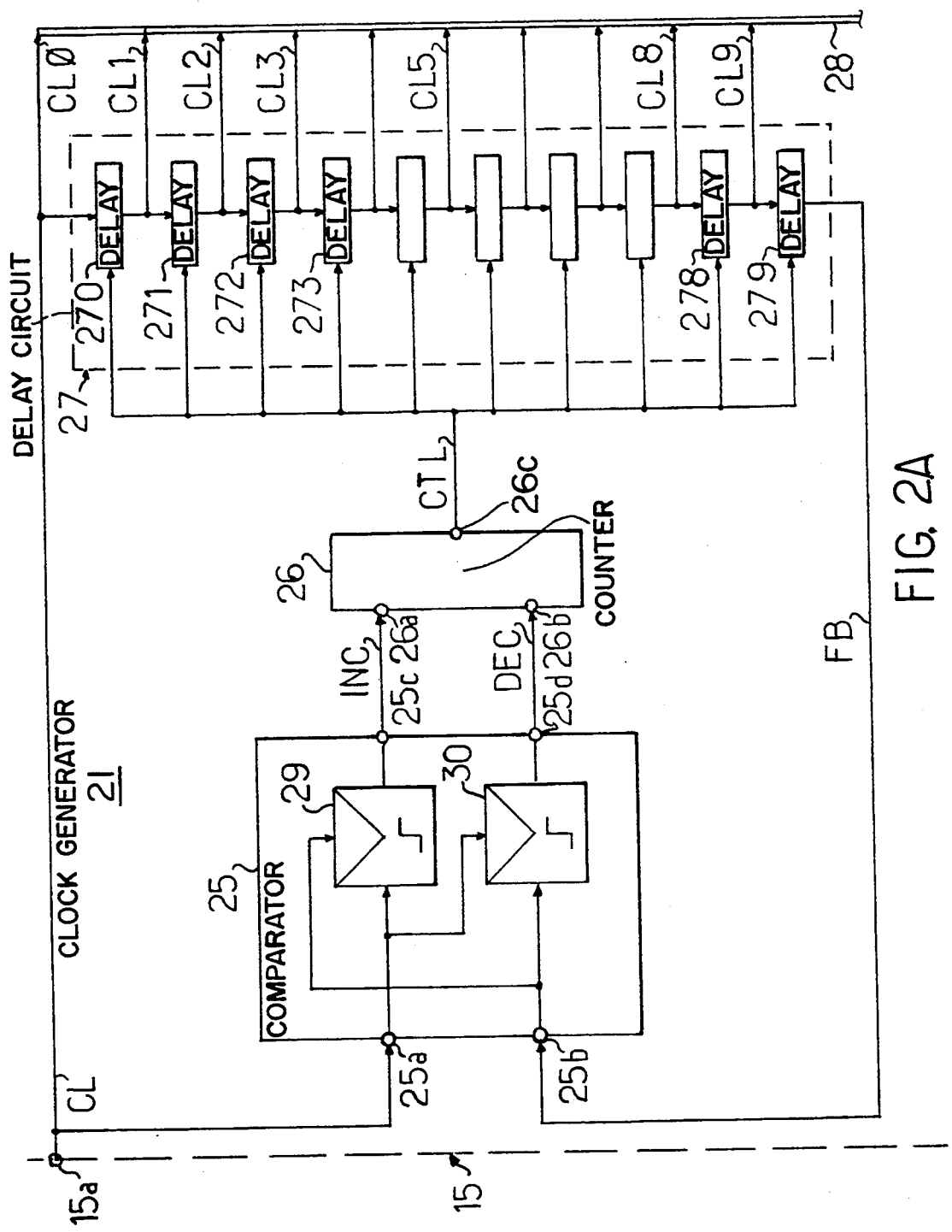
FIGS. 2A and 2B schematically illustrate the structure of a serializer-encoder included in the transmitter of the transmission system of FIG. 1.
Figure 2B:
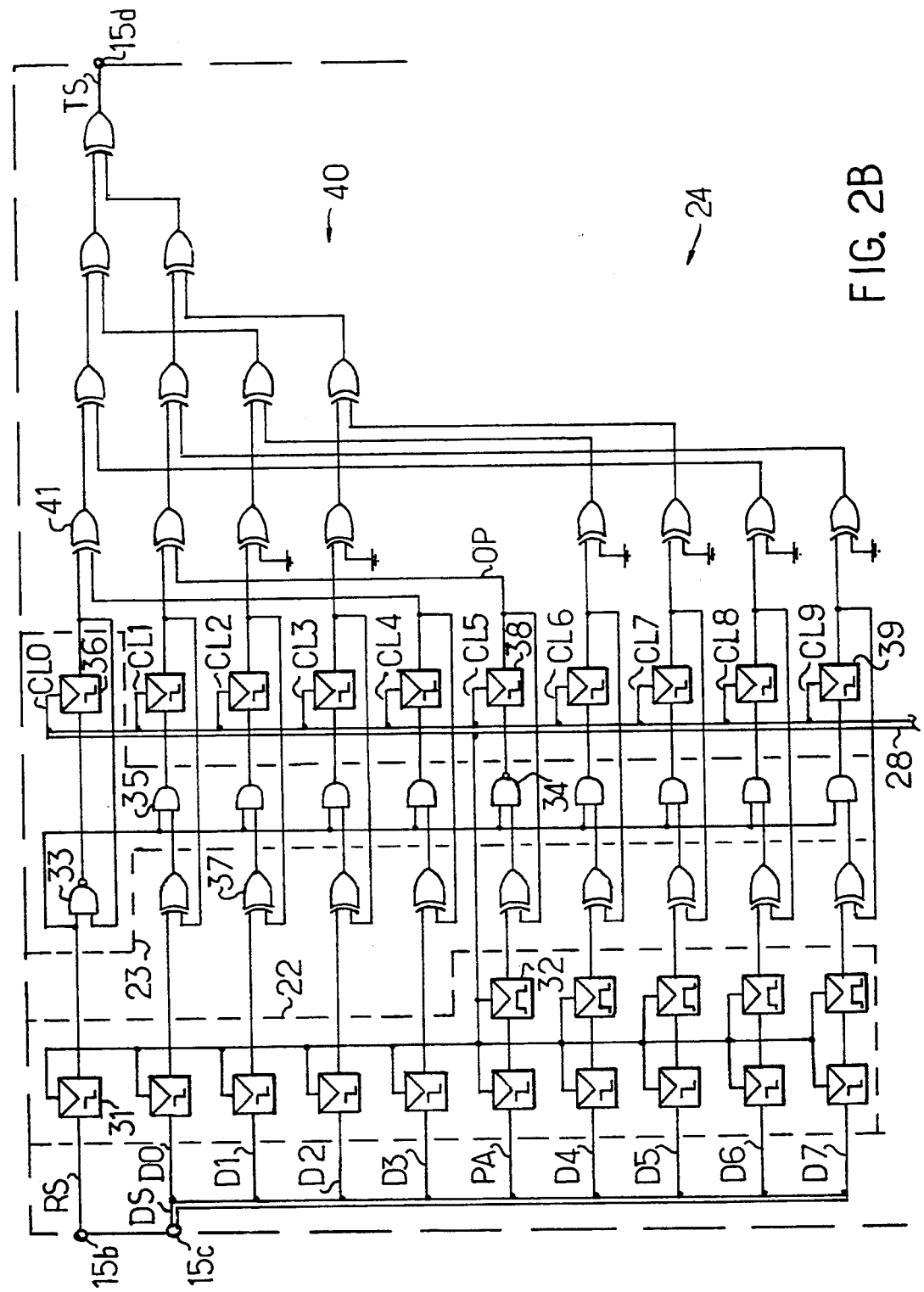

FIGS. 2A and 2B schematically show the electrical circuit of the serializer-encoder 15. The serializer-encoder 15 has, in FIG. 2A, one input 15a receiving the clock signal CL and, in FIG. 2B, one input 15b receiving the reset signal RS, one input 15c receiving the data input signal DS, and one output 15d furnishing the transmission signal TS. It is composed of an auxiliary clock generator 21 connected to the input 15a of the serializer-encoder 15 and shown in FIG. 2a, a buffer block 22, a synchronizer generator 23, and a serializer-encoder block 24, which are shown in FIG. 2B.

The auxiliary clock generator 21 shown in FIG. 2A comprises a phase-locked loop, such as that described in French Patent Application No. 90 01366 filed on Feb. 6, 1990 by the present applicant. The generator 21 includes: the input terminal 15a; a phase comparator 25 having a first input terminal 25a connected to the input terminal 15a, a second input terminal 25b, and two output terminals 25c, 25d; an up-down counter 26 having two input terminals 26a, 26b respectively connected to the output terminals 25c, 25d of the phase comparator 25, and one output terminal 26c; a phase delay circuit 27 comprising ten delay elements 270-279 connected in series between the two input terminals 25a and 25b of the phase comparator 25 and each provided with a control terminal connected to the output terminal 26c of the up-down counter 26; and an output 28 comprising a clock bus connected to the respective output terminals of the delay elements 270-279.

The phase comparator 25 is composed of two registers 29 and 30 that are sensitive to the leading edges. The register 29 has its data input connected to the input terminal 25a, its clock input connected to the input terminal 25b, and its output connected to the output terminal 25c. The register 30, similarly, has its data input connected to the input terminal 25b, its clock input connected to the input terminal 25a, and its output connected to the output terminal 25d.

Figure 3:
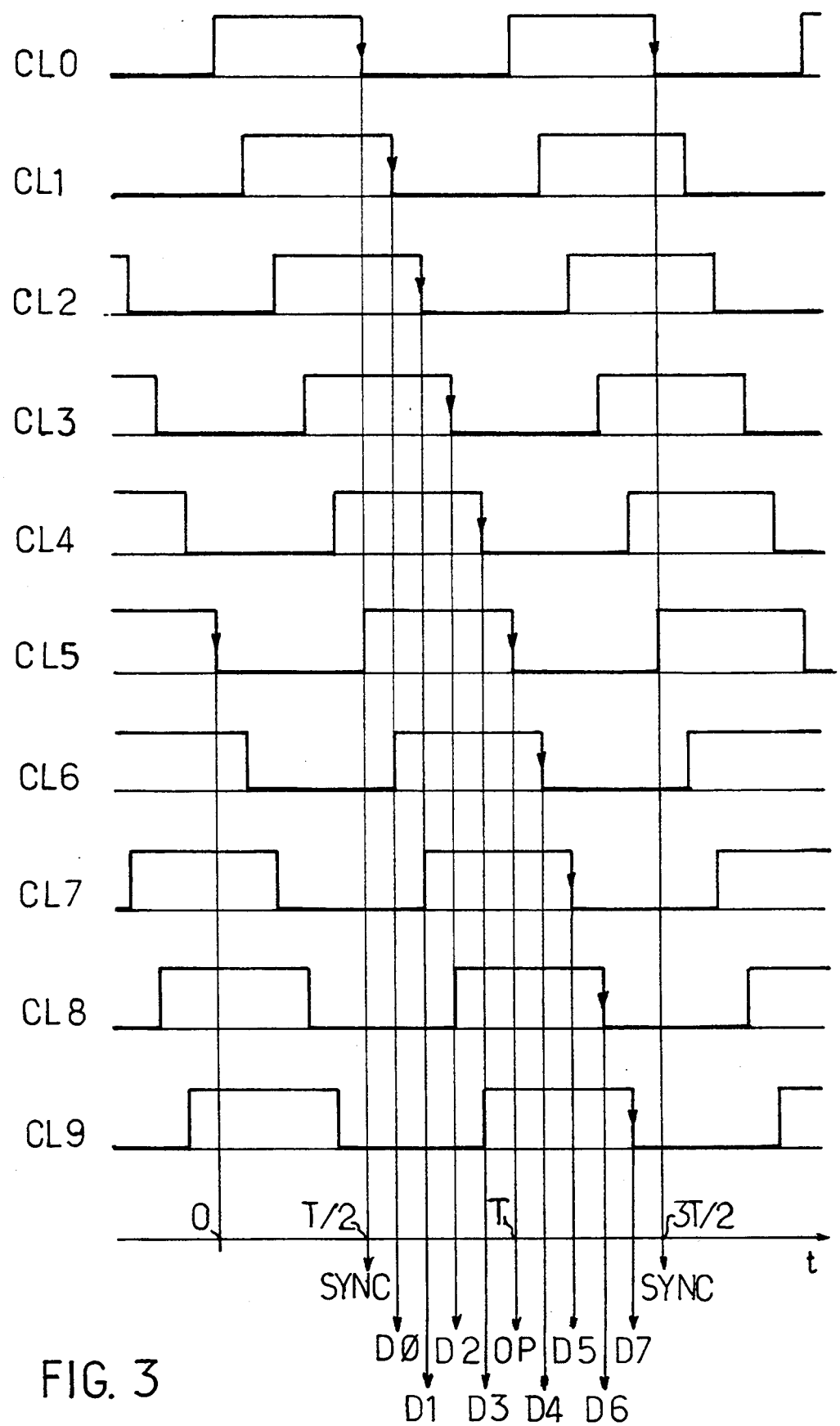
FIG. 3 shows the wave forms of the auxiliary clock signals furnished by the circuit shown in FIG. 2A and illustrates the function of the circuit shown in FIG. 2B.

FIG. 3 illustrates the wave forms, with respect to the time axis t, of the ten input signals CL0-CL9 of the respective delay elements 270-279 of the phase delay circuit 27. The signals CL0-CL9 are applied to the clock bus 28. The signal CL0 corresponds to the clock signal CL. The clock signal CL0 illustrated is a square signal of period T. The output signal of the last delay element 279 comprises a negative feedback signal FB applied to the negative feedback terminal 25b of the phase comparator 25. The comparator 25 then compares the phase of the negative feedback signal FB with the phase of the clock signal CL=CL0. The two output terminals 25c and 25d of the phase comparator 25 furnish an incrementation signal INC and a decrementation signal DEC, respectively. In response, the up-down counter 26 furnishes the control signal CTL applied to the respective control terminals of the ten delay elements 270–279. In the conventional manner, each delay element is composed of a predetermined number of elementary delay cells. The control signal CTL represents a digital value, which is applied to each delay element to cause it to vary the duration of the delay. The possible range of variation of the duration of the delay of a delay element in the course of a period T of the clock signal CL corresponds to a predetermined fraction 1/P of the maximum extent of the variation and duration of a delay element. In other words, a given integral number P of periods T is necessary to pass between the two extreme values of the maximum extent of variation of the delay of one element.

In operation, the clock signal CL is delayed successively by the ten delay elements 270–279. The ten successive delays produced by the elements 270–279 are each and in principle divide the period T of the clock signal CL. If this is done precisely in practice, the signals CL and FB entering into the phase comparator 25 and applied to the registers 29 and 30 have the same phase and the same frequency. The signals DEC and INC furnished by the registers 29 and 30 thus have the same logical value. The up-down counter 26 is accordingly not activated and leaves the control signal CTL unchanged. The ten clock signals CL0–CL9 are correctly delayed with respect to one another by the same value T/10. In practice, a margin of tolerance m of the phase displacement between the clock signal CL and the negative feedback signal FB is determined. A phase displacement within the margin m leaves the signals INC and DEC unchanged and accordingly is not likened to a phase displacement requiring correction. The margin m may be determined by the establishment times of the registers 29 and 30 and/or by the relative delays between the data input and clock input signals of each register, for example. The width of the margin m determines the precision of the phase comparison effected by the comparator 25. Typically, it is on the order of 50 ps for a period T=5 ns of the clock signal CL.

If the negative feedback signal FB is leading the clock signal CL in phase, the decrementation signal DEC has the logical value of 0 and the incrementation signal has the value of 1. The up-down counter 26 is then incremented so that the control signal CTL will increase by equal amounts the durations of the delays produced by the elements 270–279. On the other hand, if the negative feedback signal FB is lagging behind the clock signal CL, then the incrementation signal INC has the value 0 and the decrementation signal DEC has the value 1. The up-down counter 26 is decremented so that the control signal CTL will shorten the durations of the delays produced by the elements 270–279 equally. Consequently, any phase displacement beyond the margin of tolerance m is corrected for all the delay elements 270–279, to re-establish the desired phase displacements.

The digital phase control employed in the phase-locked loop comprising the auxiliary clock generator 21 offers a major advantage. If the clock signal CL is interrupted, then the negative feedback signal FB is also interrupted on principle. The registers 29 and 30 of the phase comparator 25 no longer receive any signal at their clock input and accordingly each maintains the most recent state of the transmission. The up-down counter 26 likewise maintains its most recent state, and consequently the state of the delay elements 270–279. In other words, the generator 21 maintains the most recent state of the transmission. It follows that the re-appearance of the first edge of the clock signal CL will immediately produce the correct output signals CL0–CL9, if the frequency of the clock signal CL has not changed. Otherwise, the delays are adjusted by the up-down counter 26 upon the second cycle of the clock signal CL, with a view to producing the desired output signals CL0–CL9. In conclusion, the duration for establishment of correction operation of the generator 21 may be zero, or at worst equal to the aforementioned number P of periods T of the clock signal for passing between the two extreme values for the extent of variation of the duration of each delay element. Consequently, the start-up of the generator 21, or the reactivation of a transmission line, transpires in a very brief time.

A second advantage is the wide band of operating frequencies of the auxiliary clock generator 21. The width of the band depends essentially on the range of variable delays of each delay element 270–279, as will become apparent hereinafter.

Another advantage is that the clock signal CL and the negative feedback signal FB, which are compared by the phase comparator 25, in principle have the same frequency. The structure of the comparator 25 may be quite simple, like that shown. Furthermore, the comparator can accommodate a wide band of operating frequencies. In summary, the auxiliary clock generator 21 solves all the problems that the use of a conventional PLL presents. Another advantage offered by the generator 21 resides in its adaptation to the various forms of the clock signal CL. In the example shown, the cyclic ratio of the clock signal can be arbitrary.

Figure 4A:
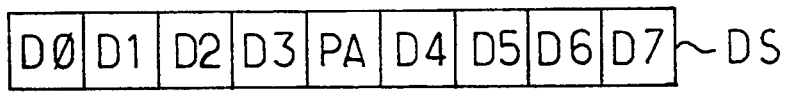
FIGS. 4A and 4B, respectively, show the general structure of a data signal word and of a transmission signal word, while FIGS. 4C and 4D, on the one hand, and 4E, 4F, on the other, respectively illustrate two digital examples relating to the aforementioned two words.

In FIG. 2B, the buffer block 22 of the serializer-encoder 15 is connected to the input terminal 15b receiving the reset signal RS, to the input terminal 15c receiving the parallel input signal DS, and to the clock bus 28 of the generator 21 shown in FIG. 2A. By way of example, FIG. 4A shows the structure of one word of the data input signal DS applied to the terminal 15C of the serializer-encoder 15. The word is composed of eight data bits D0–D7 and one parity bit PA placed between the middle data bits D3 and D4. The buffer block 22 is composed of ten registers 31 that are sensitive to the trailing edges, and five level registers 32, each having one data input, one clock input, and one output. All the registers 31 and 32 have their clock input receiving the clock signal CL5 of the clock bus 28 of the auxiliary clock generator 21. The ten registers 31 have their data inputs receiving the reset signal RS, the first four data bits D0–D3, the parity bit PA, and the last four data bits D4–D7 of the input signal DS, respectively. The outputs of the registers 31 relating to the parity bit PA and to the last four data bits D4–D7 are applied to the respective signal inputs of the level registers 32.

The synchronizing generator 23 includes two NAND gates 33, 34 with two inputs each, and eight AND gates 35 with two inputs each. The first inputs of the gates 33, 34 and 35 are connected to the output of the register 31 relating to the reset signal RS. The generator 23 also includes a trailing edge register 36 having its clock input receiving the clock signal CL0 of the clock bus 28, its data input connected to the data output of the NAND gate 33, and its output applied to the second input of the NAND gate 33.

The serializer-encoder block 24 includes nine EX-CLUSIVE-OR gates 37 with two inputs each, the first inputs of which are connected to the corresponding outputs of the four registers 31 relating to the first four data bits D0–D3 and to the respective outputs of the five registers 32. The outputs of the gates 37 relating to the data bits D0–D7 are connected respectively to the second inputs of the AND gates 35, and the output of the gate 37 relating to the parity bit PA is connected to the second input of the NAND gate 34. The serializer-encoder block 24 includes a trailing edge parity register 38, having its data input connected to the output of the NAND gate 34, and eight trailing edge data registers 39, the respective data inputs of which are connected to the outputs of the AND gates 35. The parity register 38 is controlled by the clock signal CL5, and the eight data registers 39 are controlled by the clock signals CL1–CL4 and CL6–CL9 of the bus 28. The respective outputs of the registers 38 and 39 are applied to the second inputs of the corresponding EXCLUSIVE-OR gates 37. Finally, the serializer-encoder block 24 includes a logical adder 40, consisting of a tree with four stages of EXCLUSIVE-OR gates 41 with two inputs each. The two inputs of the first gate 41 of the first stage receive the respective output signals of the synchronizing register 36 and the register 39 for the datum D3. The second gate 41 of the first stage receives the respective output signals of the parity register 38 and the register 39 for the datum D0. The other six gates 41 of the first stage have their first inputs connected to the outputs of the registers 39 for the data D1, D2, D4, D5, D6 and D7, and their second inputs are connected to ground. The respective outputs of the gates 41 of the first stage relating to the synchronizing bit and to the data bits D0–D2, on the one hand, and those relating to the data bits D7, D6, D5 and D4, on the other, respectively supply the two inputs of the four gates 41 of the second stage of the adder 40. The outputs of the first and third gates 41 of the second stage and those of the other two gates 41 respectively supply the two gates 41 of the third stage, which in turn supply the gate 41 of the last stage. The output of that gate furnishes the transmission signal TS to the output terminal 15d of the serializer-encoder 15.

The operation of the serializer-encoder 15 will now be described, referring to FIGS. 2B, 3 and 4A–4F. Before initialization of the system 10, the reset signal RS applied to the input 15b is in the logical 0 state, such that the outputs of the gates 33, 34 and 35 are all inactivated. Upon initialization, they are activated by the setting of the reset signal RS to the level of logical 1. Let it be assumed that the clock signal CL is applied to the input 15a and the clock bus 28 furnishes the ten auxiliary clock signals CL0–CL9 shown in FIG. 3. The registers 31 are controlled at time t=0 by the trailing edge of the clock signal CL5 in phase opposition with the clock signal CL0. The reset signal RS and the nine bits of the data input signal DS shown in FIG. 4A are input into the respective registers 31. In the synchronizing signal generator 23, the logical 1 state of the output of the gate 33 is memorized in the register 36 controlled by the trailing edge of the clock signal CL0. Given that the operation of the system 10 is ruled by the logical 1 state of the signal RS, the gate 36 changes state at each trailing edge of the clock signal CL0.

The data bits D0–D3 memorized in the respective registers 31 are transmitted to the corresponding gates 37. Each gate 37, with the register 39, forms an elementary encoding cell of the NRZI type. It has been seen that the gate 35 is simply an element for activating the operation of the cell. If the data bit D0, for example, has the state of logical 1, the trailing edge of the clock signal CL1 will change the logical state of the output of the register 39. Contrarily, if D0 has the state of logical 0, the logical state of the output signal of the register 39 is unchanged by the passage of the trailing edge of the clock signal CL1. FIG. 3 shows the succession of encoding of the data bits D0–D3 corresponding to their serialization at the speed, or rate, R of T/10.

Meanwhile, it is apparent from FIG. 3 that the encoding of the parity bit PA occurs at time t=T, where the registers 31 are controlled to memorize the bits of the next word of the data input signal DS. The registers 32 prevent loss of the parity bit PA and of the data bits D4–D7 of the first word. Consequently, the serialization continues by the encoding of the parity bit PA, inverted by the NAND gate 34, to constitute an odd parity bit OP, and then by the encoding of the data bits D4–D7. The encoding and serialization of the synchronizing and data bits of the next word recorded at time t=3T/2 continues in the manner that has just been described.

The signals furnished successively by the encoding cells are added in the adder 40 to form the serial transmission signal TS which is applied to the output 15d of the serializer-encoder 15. The adder 40, with the phase-locked loop of the auxiliary clock generator 21, constitutes a frequency multiplier with a multiplication factor equal to the number of phase displacements of the clock signal CL in one period, the number being 10 in the example shown. A more-detailed description of a frequency multiplier of this kind can be found in the French Patent Application by the present applicant referred to earlier above.

The invention profits from the embodiment of the logical adder 40 in the form of integrated circuits. The uniformity of the characteristics of transformers in the same integrated circuit makes it possible to equalize the propagation times between the clock signal outputs CL0 and CL9 and the output 15d of the adder. This assures the formation of a high-quality multiple frequency.

The frequency multiplier that has just been described enjoys all the advantages of both the phase-locked loop 21 and a logical adder. Those that can be mentioned in particular are its simplicity, reliability, and adaptability to a wide band of operating frequencies. For example, with a clock signal CL of period T varying between 5 ns and 10 ns, and with the delay circuit 27 having ten delay elements each capable of producing a delay varying from 500 to 1000 ps, it is possible to obtain a speed of between 1 and 2 Gbps at the output 15d of the serializer-encoder 15.

Figure 4B:
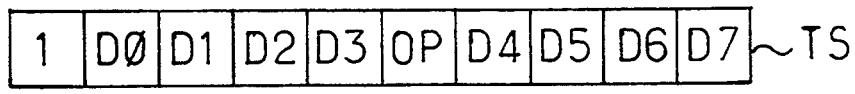
Figure 4C:
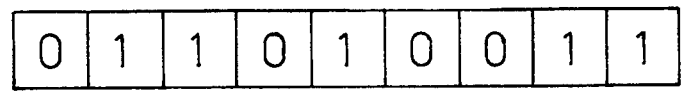

FIG. 4B shows the structure of one word of the serial transmission signal TS. Each word of the signal TS includes the word of signal data DS, preceding by the synchronizing bit SYNC, which is always equal to one. FIG. 4C shows an illustrative example of a word of the data signal DS, in which the number of data bits of logical 1 value is even, so that the odd parity bit OP thus has the value of logical 1. This word produces the wave form of the transmission signal TS shown in FIG. 4D relating to FIG. 4B. It should be noted that the synchronizing bit SYNC is translated into a leading edge comprising a synchronizing edge SE in the transmission signal TS. FIG. 4E shows the case of a word of the data input signal DS in which the odd parity bit OP has the value of logical 0, corresponding to an odd number of data bits of logical 1 value. It is apparent from FIG. 4F in conjunction with FIG. 4B that the synchronizing bit SYNC is again translated into a leading edge comprising the synchronizing edge SE in the transmission signal TS. In summary, the addition of a synchronizing bit SYNC of logical 1 value in each data word incorporating an odd parity bit OP translates into the same synchronizing edge SE in the transmission signal TS, which in the exemplary embodiment shown is a leading edge.

In summary, the apparatus according to the invention for the serialization of words of ten bits that has been described above has the following characteristics and advantages. It is controlled by a clock signal CL of period T that is 10 times lower than the period of recurrence R of the bits of the word. Based on this clock signal, the ten auxiliary clock signals CL0–CL9 are produced, having the same period T as the clock signal CL and delayed successively by the period T/10. The ten auxiliary clock signals CL0–CL9 control the successive output of the ten respective bits of each word. In other words, each bit exits or is output at the rate of the corresponding auxiliary clock signal. The reunion of the ten exiting bits of each word is done at the rate R of T/10 and thus constitutes the output signal of the serializer. A serializer according to the invention affords the major advantage of processing only signals having a low frequency and the same value. The high-speed output signal is formed solely at the output of the serializer. It is accordingly highly suitable for the generation of very high-speed signals. Moreover, the embodiment of this serializer according to the invention is facilitated. The invention also judiciously benefits from embodiment of the serializer in the form of integrated circuits. The uniformity of the characteristics of the transistors in the same integrated circuit makes it easy to have identical delays in the auxiliary clock signal generator and to equalize the propagation time of the signals of the tree of gates comprising the logical adder 40.

Controlling the output of the bits by the auxiliary clock signals CL0–CL9 is achieved simply by the ten registers 36, 38 and 39. Advantageously, these ten registers can serve to encode the bits, as shown. It is sufficient to add to each register one EXCLUSIVE-OR gate 37, to constitute an NRZI encoding cell.

The embodiment of a serializer according to the invention may be different from that shown. In particular, the foregoing description can certainly be adapted to the serialization of any arbitrary number N of bits in one word. It suffices to generate N auxiliary clock signals of period T that are delayed successively by the value T/N, and to apply them to the N respective registers.

In the receiver 13 of the system 10 according to the invention, the transmission signal TS received at the input 13a is shaped and amplified in the amplifier 17, and then applied to the clock recuperator 18 and to the deserializer-decoder 19.

Figure 5:
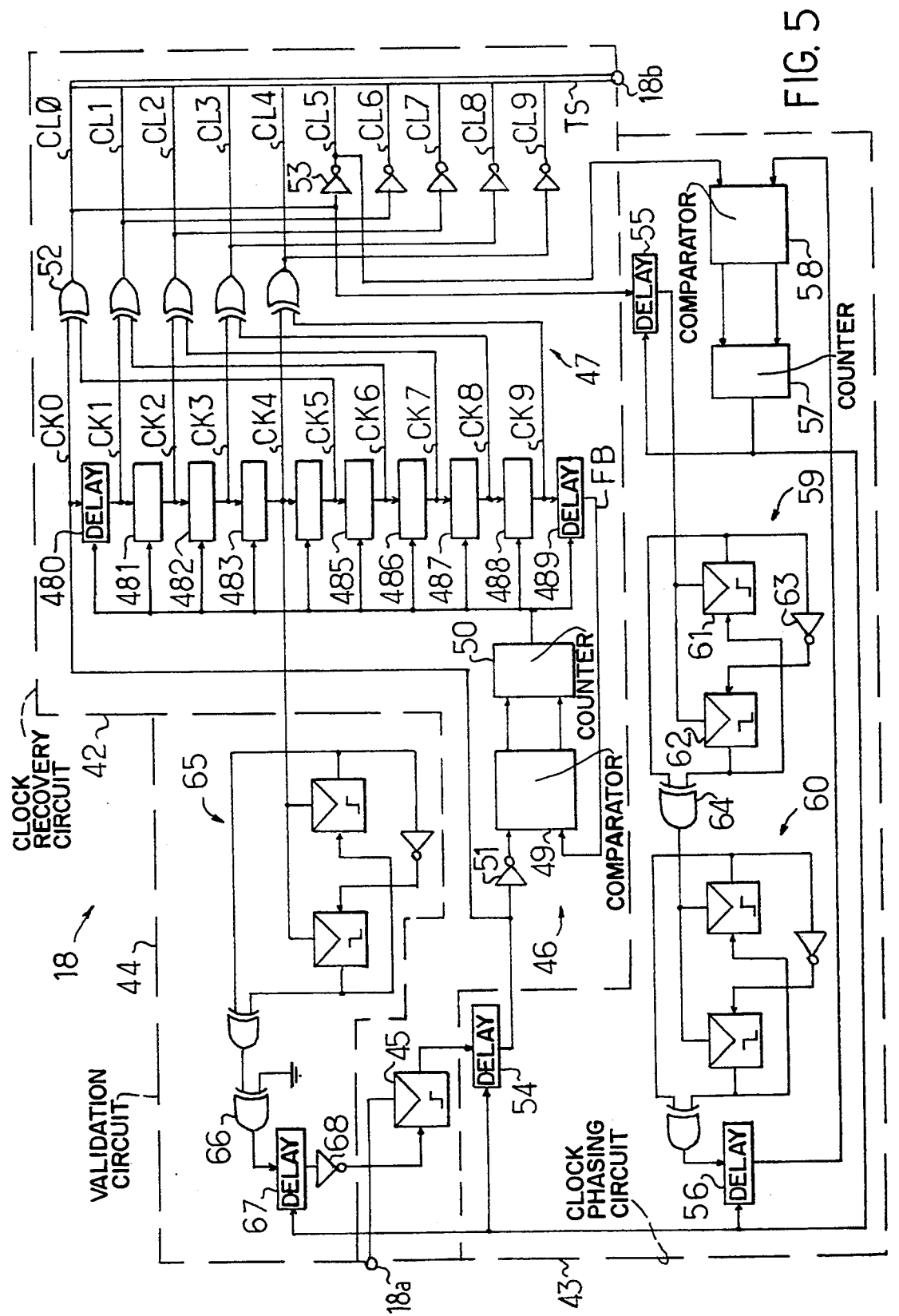
FIG. 5 schematically illustrates the electrical circuit of the clock recuperator, which is included in the receiver of the transmission system shown in FIG. 1.

FIG. 5 schematically illustrates the electrical circuit of the clock recuperator 18. It has one input 18a for the transmission signal TS and an output bus 18b for the ten auxiliary clock signals CL0–CL9 recovered in the transmission signal TS. It includes a clock recovery circuit 42, a clock phasing circuit 43, and a validation circuit 44.

The clock recovery circuit 42 includes a leading edge input register 45, a phase-locked loop 46 similar to the auxiliary clock generator 21 describes in conjunction with FIG. 2A, and a logical adder 47. The input register 45 receives the transmission signal TS at its clock input. Its output is connected to the input of the phase-locked loop 46, embodied by ten serial delay elements 480–489, a phase comparator 49, an up-down counter 50, all identical in structure to those of the circuit 21, and an inverter 51. The ten input signals of the respective delay elements 480–489 comprise intermediate clock signals CK0–CK9, while the negative feedback signal FB originating in the last delay element 489 is applied to the negative feedback input of the phase comparator 49. The other input of the phase comparator 49, by way of the inverter 51, receives the output signal of the register 45. The delay elements 480–489 are controlled by the output signal of the up-down counter 50 as a function of incrementation and decrementation signals furnished by the phase comparator 49. It will be seen hereinafter that the intermediate clock signals CK0–CK9 have a frequency that is half that of the clock signals CL0–CL9. The logical adder 47 and the phase-locked loop 46 form a frequency multiplier with a factor of 2 to furnish the clock signals CL0–CL9 on the output bus 18b of the clock recuperator 18. The adder 47 includes five EXCLUSIVE-OR gates 52 with two inputs each and five inverters 53. The gates 52 have their first inputs respectively receiving the intermediate clock signals CK0–CK4, their second inputs respectively receiving the other signals CK5–CK9, and their respective outputs furnishing the clock signals CL0–CL4. These five clock signals are inverted by the five respective inverters 53 to furnish the other five clock signals CL5–CL9.

The clock phasing circuit 43 includes a first delay element 54 receiving the output signal of the input register 45 and supplying the input of the inverter 51 and the input of the phase-locked loop 46, which corresponds to the intermediate clock signal CK0; a second delay element 55 receiving the intermediate clock signal CK0; and a third delay element 56. These three delay elements have a structure similar to that of the delay elements 480–489. Their delay is controlled by the output signal of an up-down counter 57 in response to the incrementation and decrementation signals furnished by a phase comparator 58. The comparator 58 receives the clock signal CL5 and the output signal of the third delay element 56 as a negative feedback signal. The second delay element 55 receives the clock signal CL0 and furnishes an output signal to the input of a first delay cell 59 connected in series with a second, identical delay cell 60 furnishing the input signal of the third delay element 56. Each delay cell 59, 60 is composed of a leading edge register 61, a trailing edge register 62, an inverter 63, and an EXCLUSIVE-OR outlet gate 64 having two inputs. The output signal of the delay element 55 is applied to the respective clock inputs of the registers 61 and 62. The output of the register 62 is connected to the data input of the register 61, the output of which is connected by way of the inverter 63 to the data input of the register 62. The respective output signals of the registers 61 and 62 are applied to the two inputs of the gate 64.

The validation circuit 44 validates the input register 45 of the clock recovery circuit. It is controlled by the intermediate clock signal CK4 and furnishes the data signal of the input register 45. It includes a delay cell 65, similar to the cells 59 and 60; an EXCLUSIVE-OR gate 66; a delay element 67; and an inverter 68. In the cell 65, the respective clock inputs of the registers 61 and 62 receive the intermediate clock signal CK4, and the outlet gate 64 furnishes a signal applied to one input of the gate 66. This gate has its other input connected to ground, and its output furnishes the input signal to the delay element 67. The delay element 67 is similar to the others and is controlled by the output signal of the up-down counter 57 of the clock phasing circuit 43, to furnish the data signal of the input register 45 by way of the inverter 68.

The deserializer-decoder 19 will now be described, with reference to FIG. 6. It has one input 19a receiving the transmission signal TS of the amplifier 17; a clock input 19b connected to the clock bus 18b originating in the clock recuperator 18; and an outlet bus 19c furnishing the recovered data signal RD. The deserializer-decoder 19 includes the following: a sampling circuit, composed of nine leading edge input registers 69, respectively controlled by the nine clock signals CL0–CL7 and CL9 picked up by the bus 18b and all receiving the transmission signal TS; and an output circuit composed of eight EXCLUSIVE-0R gates 70 with two inputs, and two inverters 71, 72. The two inputs of each gate 70, respectively, receive the output signal of the corresponding register 69 and the output signal of the preceding register 69. Thus for example the first gate 70, at the top of the drawing, receives the output signals of the registers 69 controlled by the clock signals CL0 and CL9; the second gate 70 receives those of the registers 69 that are controlled by the clock signals CL1 and CL0, and so forth, and the eighth gate 70 receives those of the registers 69 that are controlled by the clock signals CL7 and CL6. The output of the fourth gate 70 is connected to the inverter 71, and the output of the register 69 controlled by the clock signal CL9 is connected to the inverter 72. The respective outputs of the first through the last gate 70 furnish the data bits D1, D2, D3, OP, D4, D5, D6, D7, and the output of the inverter 72 furnishes the data bit D0. The odd parity bit OP is inverted to constitute the parity bit PA. The data and parity bits are applied to the outlet bus 19c.

Figure 6:
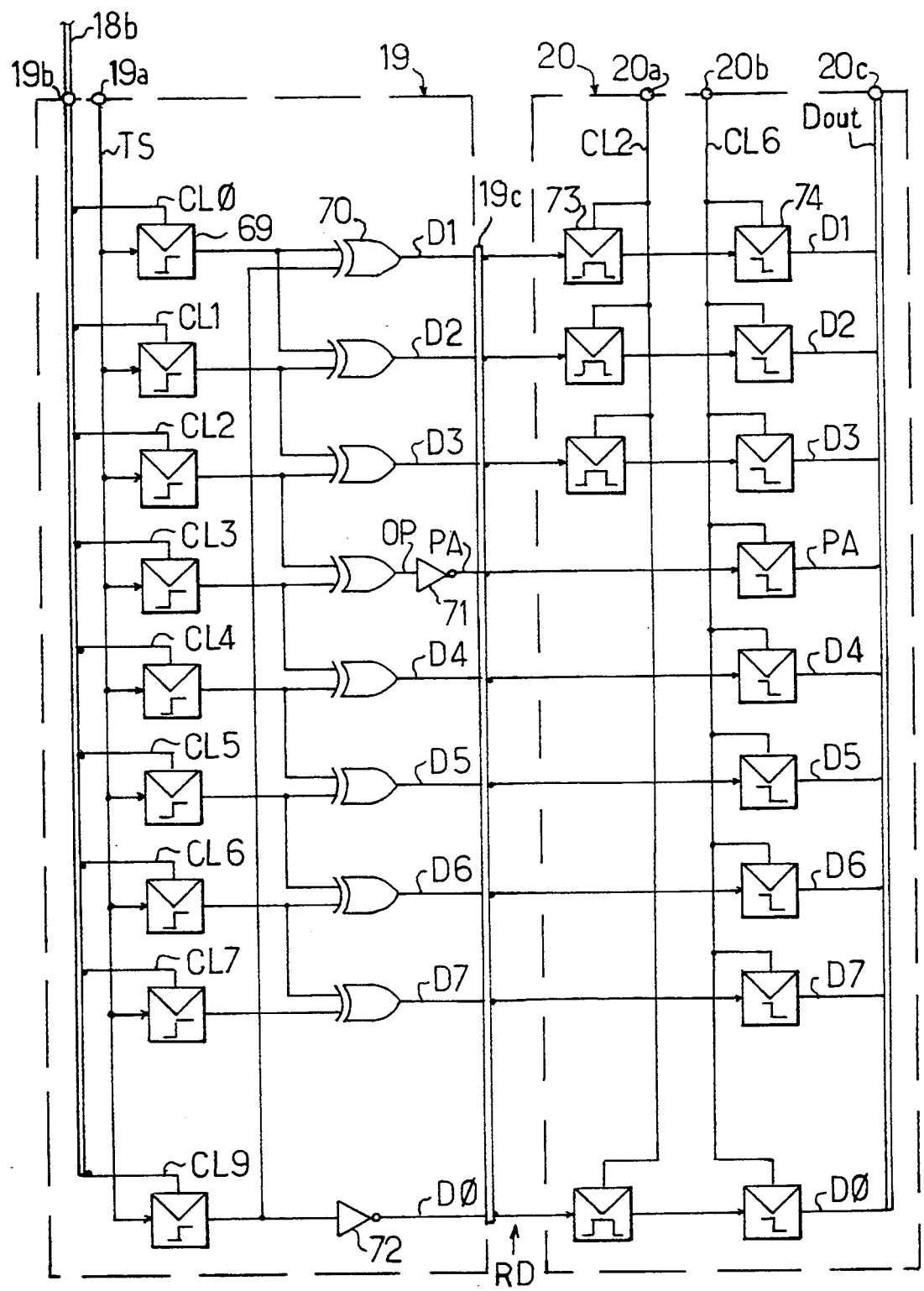
FIG. 6 illustrates the electric circuit of the deserializer-decoder according to the invention and of the output buffer included in the receiver of the transmission system shown in FIG. 1.

FIG. 6 also schematically shows the electrical circuit of the outlet buffer 20 shown in FIG. 1. The outlet buffer 20 has one signal input connected to the bus 19c, two clock inputs 20a and 20b receiving the respective clock signals CL2 and CL6, and an outlet bus 20c furnishing the outlet signal Dout of the receiver 13 of the system 10 according to the invention. The buffer 20 includes four level registers 73 and nine trailing edge output registers 74. The level registers 73 are controlled by the clock signal CL2 and have their data inputs receiving the bits D1–D3 and D0, respectively, of the input bus 19c. The output registers 74 are controlled by the clock signal CL6. Four of the registers 74 have their respective data inputs connected to the outputs of the four level registers 73. The other registers 74 have their respective inputs receiving the parity bit PA and the data bits D4–D7 of the bus 19c. The respective outlets of all the registers 74, in the order indicated in FIG. 4A, furnish the data bits D0–D7 and the parity bit PA, to restore an output signal Dout that is identical to the input signal DS of the transmitter 12.

Figure 7:
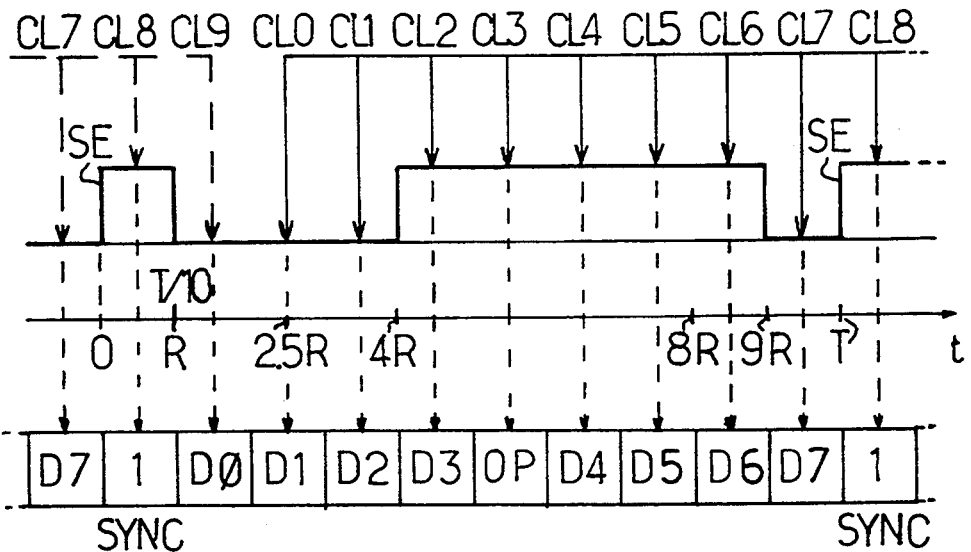
FIG. 7 reproduces FIGS. 4A and 4F and schematically illustrates the function of the deserializer-decoder shown in FIG. 6.

FIG. 7 takes the example of 4E again, with reference to the time axis t, and for ease in reading, FIG. 4B, and schematically illustrates the operation of the clock recuperator 18 shown in FIG. 5. In the recuperator 18, the signal TS is applied to the clock input of the leading edge register 45. This register is assumed to be validated by the validation circuit 44, to be controlled at the passage, at time t=0, of a synchronizing edge SE. Just after t=0, the register 45 is controlled by the validation circuit 44 so that it does not react to the corresponding edges of the following data and odd parity bits, and reacts to only the next synchronizing edge SE at time t=T. The frequency of the clock signal formed by the synchronizing edges SE detected by the register 45 is accordingly ½T. In other words, the register 45 furnishes an intermediate clock signal CK0 having a frequency half that of the clock signal CL0 transmitted. In the phase-locked loop 46, the ten delay elements 480–489 successively produce ten identical delays sharing the half-period T of the clock signal CK0 and furnishing the ten intermediate clock signals CK0–CK9 and the negative feedback signal FB. Because of the period 2T of the signal CK0, this signal is in phase opposition with the negative feedback signal FB and thus passes through the inverter 51, so that these two signals will be in phase at the respective inputs of the comparator 49. For the same reason, the logical adder 47 and the circuit 46 form a frequency multiplier with a factor of 2, in order to furnish the ten clock signals CL0–CL9 successively, and uniformly delayed among themselves, within the period T, like those generated upon transmission. In the example shown, the synchronizing edge SE detected by the register 45 undergoes a first delay Θ1 upon passing through this register, and a second delay Θ2 in the delay element 54, to constitute one edge of the intermediate clock signal CK0. This latter edge undergoes a third delay Θ3 in the gate 52, to become one edge of the auxiliary clock signal CL0.

Figure 4D:
Figure 4E:
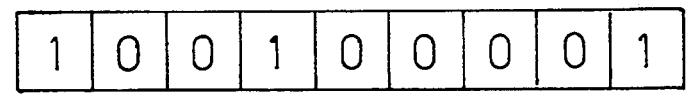
Figure 4F:
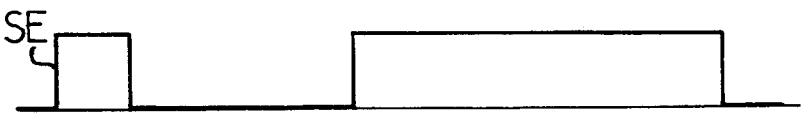

It is apparent from FIG. 4D, 4F and 7 that the last possible leading edge in the signal TS corresponds to the data bit D6 at time t=8T/10. After that time, the validation circuit 44 can validate the signal input of the register 45 to detect the next leading synchronizing edge at time t=T. In the example shown, the validation of the register 45 is done at time t=9T/10=9R, determined by the accumulation of the following delays of the synchronizing edge SE beginning at time t=0. This edge initially undergoes the delays Θ1 and Θ2, to constitute and edge of the signal CK0. If the duration of a delay of each element 480–489 is designated as Θ4, then the delay of the signal CL4 with respect to the signal CL0 is 4 Θ4. The signal CK4 is selected as an input signal of the validation circuit 44. In the circuit 44, the signal CK4 passes, in the delay cell 65, through one of the registers 61 and 62, depending on whether its edge is leading or trailing, and the gate 64, and then the EXCLUSIVE-OR gate 66, the delay element 67 and the inverter 68. In practice, it is assumed that all the registers have identical delays Θ1, and all the EXCLUSIVE-OR gates have identical delays Θ3, that the inverters do not delay the signals, and that the delays Θ2 are identical for the delay elements 54 and 67. The accumulated delays beginning at the register 45 add up to 9T/10. In other words, Θ1+Θ2+4 Θ4+Θ1+2 Θ3+Θ2=2 Θ1+2 Θ2+2 Θ3+4 Θ4=9T/10. At this point in the description, all the delays in this formula are known, expect for Θ2, which will now be learned from the description of the operation of the clock phasing circuit 43 of the clock recuperator 18.

The circuit 43 synchronizes the phasing of the clock signals CL0–CL9 at half the width of the respective bits of the transmission signal TS beginning at each synchronizing edge SE detected by the register 45. The half-width R/2 (0.5T/10) of the signal representing one bit corresponds in practice to the range of maximum stability of the signal, and thus optimizes determination of the logical value of each bit. In the example shown in FIG. 7, the signal CL0 is phased at 2.5R=2.5T/10, such that $\Theta 1 + \Theta 2 + \Theta 3 = 2.5T/10$. The delay produced by the element 54 is accordingly $\Theta 2 = 2.5T/10 - \Theta 1 - \Theta 3$. The synchronization of the phasing of the clock signal CL0 is done by the phase comparator 58, which compares the phase of the clock signal CL5 with that of the clock signal CL0 in phase opposition, delayed successively in the delay element 55, the delay cells 59 and 60, and the delay elements 56. The total delay is thus $\Theta 2 + \Theta 1 + \Theta 3 + \Theta 1 + \Theta 3 + \Theta 2 = 2(\Theta 1 + \Theta 2 + \Theta 3)$ and must confirm the equation $2(\Theta 1 + \Theta 2 + \Theta 3) = 5T/10$. The up-down counter 57 adjusts the duration of $\Theta 2$ in the elements 54, 55, 56 and 57 to satisfy this equation. Accordingly, the phasing of the clock signals CL0–CL9 is adjusted to the respective delays 2.5R–11.5R determined with respect to a synchronizing edge SE, such that each clock signal corresponds to the range of maximum stability of the representative signal for each bit. Moreover, the clock phasing circuit adjusts the delay of 9R of the validation signal of the register 45 with respect to each synchronizing edge detected by this register.

Figure 8:
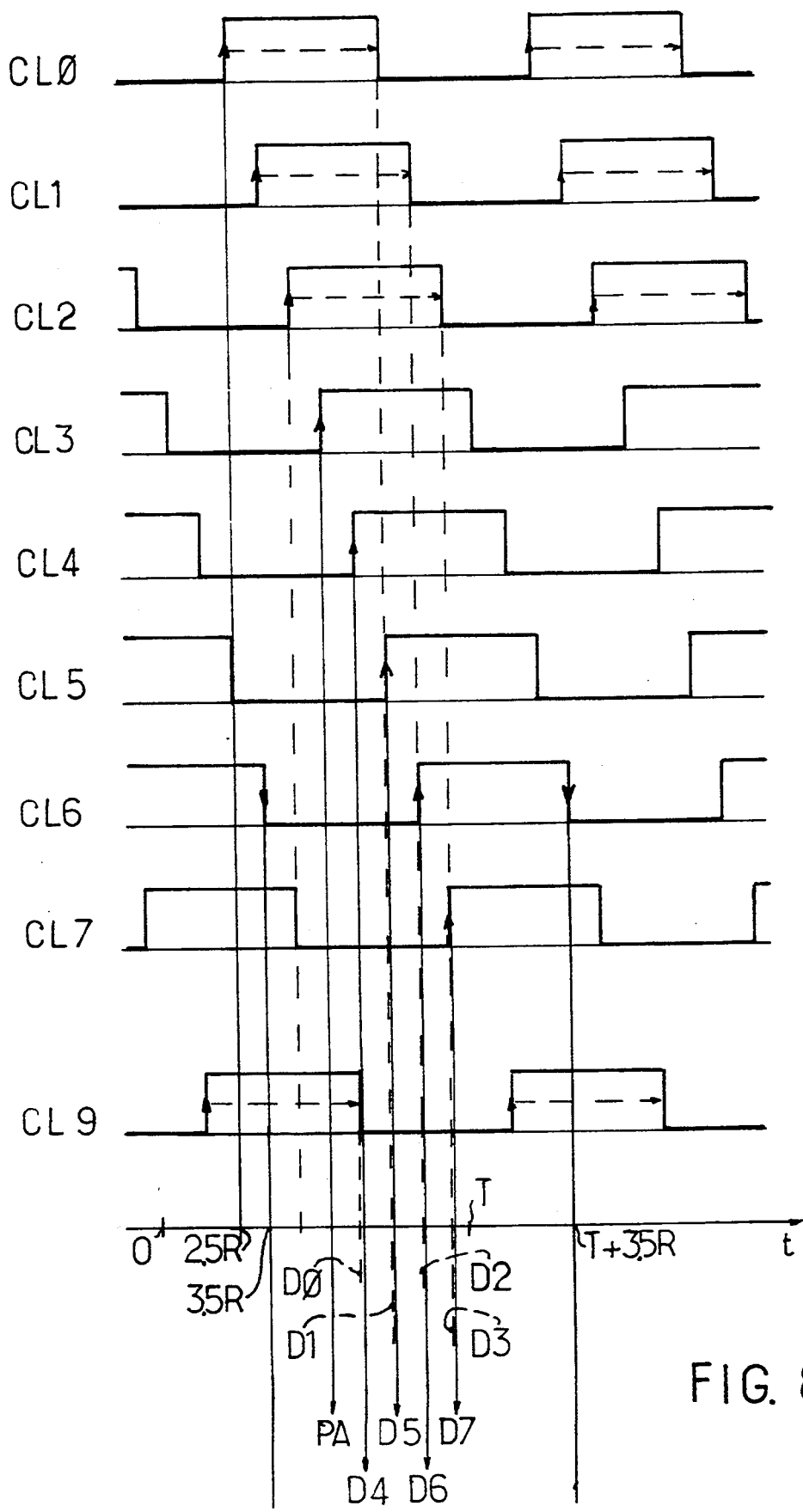
FIG. 8 is a timing diagram of the auxiliary clock signals recovered and applied to the deserializer-decoder and output buffer that are shown in FIG. 6, to illustrate their function.

FIGS. 7 and 8 illustrate the function of the deserializer-decoder 19 shown in FIG. 6. FIG. 8 shows the ten recovered clock signals CL0–CL9 with respect to the time axis indicated in FIG. 7, and illustrates the recovery of the respective data bits in correspondence with the leading edges of the clock signals. In the deserializer-decoder 19, the clock signal CL8 is not used, since it would recover the synchronizing bit SYNC, which is always equal to 1 and is useless in the data signal to be restored. It can be seen from FIGS. 6, 7 and 8 that the clock signals CL0–CL7 and CL9 respectively recover the data bits D1–D3, the odd parity bit OP, and the data bits D4–D7 and D0. If for the preceding word, the clock signal CL9 shown in dashed lines in FIGS. 7 and 8 samples a value of logical 0, this value corresponds to an equivalent edge of a data bit D0 of logical 1 value. The inverter 72 is thus sufficient to determine the value of the bit D0. The other bits are determined consequently by the EXCLUSIVE-OR gates 70 that react to the presence of an edge sampled by the corresponding registers 69. The odd parity bit OP thus recovered is inverted at 71 to restore the parity signal PA. Given that the bit D0 is determined by the clock signal CL9 of the preceding word, all the bits of the data signal RD should be put into order, to constitute a data signal identical to that transmitted.

Putting the bits of the restored signal RD into order is done in the output buffer 20 shown in FIG. 6, in the manner illustrated in FIG. 9. Putting them into order begins with the action of the clock signal CL2 on the registers 73. When the data bits D0–D3 leave the deserializer-decoder 19, the signal CL2 has the state of logical 0 and blocks the level registers 73. At time $t=4.5T/10$, the clock signal CL2 assumes the state of logical 1 and controls the memorization of the data bits D0–D3 in the registers 73. During this time, the bits PA and D4–D7 are output. Under these conditions, all the bits D0–D3, PA, D4–D7 of the same word are present at the respective inputs of the registers 74. At time $t=T+3.5T/10$, the registers 74 memorize this word. It should be noted that the next data bits D0–D3 have already been sampled, but are waiting at the input of the output buffer 20 for the next clock signal CL2 before they enter.

In summary, the deserializer according to the invention that has just been described has the following characteristics and advantages. Ten auxiliary clock signals CL0–CL9 of period T are generated by successive delays having the value T/10. In the transmission system 10 shown, the clock recuperator 42 advantageously constitutes the generator of the clock signals CL0–CL9. These clock signals control the parallel output of the respective bits of each word. Accordingly, the deserializer has the same advantages as the serializer. In particular, the parallel output of the bits is done simply by the registers controlled by the respective auxiliary clock signals CL0–CL9. Furthermore, these registers can advantageously comprise decoding registers, as shown. Normally, the ten bits should be deserialized. However, in the example shown, the synchronizing bit SYNC is always equal to 1 and is not used for restoration of the data. Nine registers are accordingly used.

Numerous variants to the exemplary embodiment described and shown may be made. In particular, it is clearly apparent that the deserializer according to the invention can be easily adapted to deserialization of any arbitrary number N of bits of a word, as in the case of a serializer. Moreover, among the N bits of a word, only some of them may be useful for restoration of the data. Consequently, the deserializer may incorporate only the number of registers corresponding to the number of useful bits in each word.

I claim:

1. An apparatus (15) for serialization of words of N parallel bits comprising means (21) for simultaneously generating N clock signals (CL0–CL9) recurring at a period T and successively occurring with a delay of T/N therebetween, control circuit means (36, 38, 39) for receiving the N clock signals and responsive to the bits of each of said words for generating N output bits successively occurring at a rate corresponding to the occurrence of said N clock signals, and means (40) for serially arranging the N output bits issued from each of said words to form a serial signal (TS).

2. The apparatus of claim 1, wherein the control circuit means includes a buffer block (22) for memorization of the N parallel bits.

3. The apparatus of claim 1, wherein means (40) for serially arranging the N output bits includes a tree of EXCLUSIVE-OR gates (41).

4. The apparatus of claim 1, wherein said control circuit means includes a number of registers N that respectively receive the N parallel bits and the N clock signals.

5. The apparatus of claim 4, wherein the N registers comprise registers for encoding the respective N parallel bits.

6. The apparatus of claim 5, wherein a signal input of each register is provided to an output of an EXCLUSIVE-OR gate (37) having one input receiving one of the N parallel bits and another input connected to an output of the register.

7. An apparatus (19) for deserialization of words of N serial bits comprising means (42) for simultaneously generating N clock signals (CL0–CL9) recurring at a period T and successively occurring with a delay of T/N therebetween, and control means (69) responsive to at least a predetermined number n of the N clock signals to provide a parallel output corresponding to a respective number n of bits of each of the words.

8. The apparatus of claim 7, and further comprising means (20) for putting n bits of the parallel output in the same order as that transmitted.

9. The apparatus of claim 7, wherein the control means includes the number n of registers receiving said respective n bits of each word and controlled by the respective n clock signals.

10. The apparatus of claim 9, wherein the registers comprise means for decoding respective bits.

11. The apparatus of claim 9, wherein the control means includes EXCLUSIVE-OR gates (70) each having one input connected to the output of a register and another input connected to the output of a preceding register.

12. A system (10) for digital data transmission, including a transmitter (12) using a clock signal (CL) recurring at a period T and a parallel input signal (DS), said transmitter including a serializer (15) and an encoder to transmit a serial signal (TS) at a transmission rate R, and a receiver (13) connected to receive the serial signal and including a clock recuperator (18) for recovering the clock signal from the serial signal, a deserializer (19) and a decoder to supply a parallel output signal Dout wherein the period T of the clock signal is a multiple N of the transmission rate R and wherein at least one of the serializer and deserializer includes means for simultaneously generating N clock signals recurring at a period T and succesively occurring with a delay of T/N therebetween.

13. The system of claim 12, wherein the deserializer includes means for generating N clock signals recurring at the period T and successively occurring with a delay of T/N therebetween, and further wherein said clock recuperator comprises said means for generating N clock signals.

* * * * *